(12) United States Patent
Gaibler et al.

(10) Patent No.: US 12,477,689 B2
(45) Date of Patent: Nov. 18, 2025

(54) COOLING SYSTEM FOR THE LIQUID IMMERSION COOLING OF ELECTRONIC COMPONENTS

(71) Applicant: WIELAND-WERKE AG, Ulm (DE)

(72) Inventors: Harald Gaibler, Rottenacker (DE); Achim Gotterbarm, Dornstadt (DE); Philipp Hofmann, Weissenhorn (DE); Verena Obst, Neu-Ulm (DE); Michael Scheuss, Cologne (DE)

(73) Assignee: WIELAND-WERKE AG, Ulm (DE)

( * ) Notice: Subject to any disclaimer, the term of this patent is extended or adjusted under 35 U.S.C. 154(b) by 99 days.

(21) Appl. No.: 18/246,400

(22) PCT Filed: Oct. 21, 2021

(86) PCT No.: PCT/EP2021/000128
§ 371 (c)(1),
(2) Date: Mar. 23, 2023

(87) PCT Pub. No.: WO2022/106046
PCT Pub. Date: May 27, 2022

(65) Prior Publication Data
US 2023/0397369 A1 Dec. 7, 2023

(30) Foreign Application Priority Data
Nov. 17, 2020 (DE) ..................... 10 2020 007 021.3

(51) Int. Cl.
*H05K 7/20* (2006.01)
(52) U.S. Cl.
CPC ......... *H05K 7/203* (2013.01); *H05K 7/20336* (2013.01); *H05K 7/20409* (2013.01)

(58) Field of Classification Search
CPC ............... H05K 7/203; H05K 7/20236; H05K 7/20318; H05K 7/20809; H05K 7/20327;
(Continued)

(56) References Cited

U.S. PATENT DOCUMENTS

| 5,099,908 A | 3/1992 | Taraci et al. |
| 10,390,458 B2 | 8/2019 | Tufty et al. |

(Continued)

FOREIGN PATENT DOCUMENTS

| CN | 111434197 A | 7/2020 |
| DE | 2320125 | 10/1974 |

(Continued)

OTHER PUBLICATIONS

German Office Action issued in corresponding German Application No. 10 2020 007 021.3 date of mailing May 31, 2021 (6 pages).

(Continued)

*Primary Examiner* — Mandeep S Buttar
(74) *Attorney, Agent, or Firm* — FLYNN THIEL, P.C.

(57) ABSTRACT

A cooling system for the liquid immersion cooling of electronic components. The cooling system includes a container having a container wall and, in the interior, a reservoir for liquid heat transfer fluid in which positioning devices for electronic components are arranged. The container has a gas chamber for gaseous heat transfer fluid. In the gas chamber of the container, there is a heat exchanger device with heat exchanger tubes for liquefying gaseous heat transfer fluid, the heat exchanger tubes having outer fins on their outer sides. The heat exchanger tubes pass into the container wall or through the container wall at passage points. The heat exchanger tubes have an integral bond with the container wall at these passage points.

9 Claims, 1 Drawing Sheet

(58) Field of Classification Search
CPC .. H05K 7/20381; H05K 7/20; H05K 7/20836; H05K 7/20281; H05K 7/2029; H05K 7/208; H05K 5/06; H05K 7/20936; G06F 1/20; G06F 2200/201; H01L 23/44; H01L 23/473; F28D 15/025
USPC ......................................................... 361/688
See application file for complete search history.

(56) References Cited

U.S. PATENT DOCUMENTS

| | | | |
|---|---|---|---|
| 10,477,726 B1 | | 11/2019 | Enright et al. |
| 10,512,192 B2* | | 12/2019 | Miyoshi ............ H01L 21/67109 |
| 2002/0162651 A1* | | 11/2002 | Nakagome ............. F02M 26/32 |
| | | | 165/158 |
| 2006/0126296 A1 | | 6/2006 | Campbell et al. |
| 2009/0166019 A1* | | 7/2009 | Tokizaki ................. F28F 1/422 |
| | | | 165/181 |
| 2014/0218858 A1 | | 8/2014 | Shelnutt et al. |
| 2015/0109728 A1 | | 4/2015 | Campbell et al. |
| 2017/0064862 A1 | | 3/2017 | Miyoshi |
| 2019/0008077 A1 | | 1/2019 | Ishinabe |
| 2019/0353355 A1* | | 11/2019 | Garrabrant ................ F24D 5/12 |
| 2020/0122189 A1* | | 4/2020 | Antonie ............. B05C 11/1042 |
| 2023/0080268 A1* | | 3/2023 | Singh ....................... B21C 23/00 |
| | | | 165/59 |
| 2025/0075981 A1* | | 3/2025 | Williams ............... B21D 53/02 |

FOREIGN PATENT DOCUMENTS

| | | |
|---|---|---|
| DE | 102008062486 A1 | 7/2009 |
| JP | 60145228 A | 7/1985 |
| JP | 8132145 A | 5/1996 |
| JP | 2001356842 A | 12/2001 |
| JP | 2006132853 A | 5/2006 |
| JP | 2007281215 A | 10/2007 |
| JP | 201912470 A | 1/2019 |

OTHER PUBLICATIONS

International Search Report with English Translation issued in corresponding International Application No. PCT/EP2021/000128 date of mailing Jan. 28, 2022 (5 pages).
Written Opinion of International Searching Authority issued in corresponding International Application No. PCT/EP2021/000128 dated Jan. 28, 2022 (5 pages).
Japanese Office Action with English translation issued in corresponding Japanese Application No. 2023-522813 dated Nov. 20, 2024 (8 pages).
Notice of Reasons for Refusal issued in corresponding Japanese Application No. 2023-522813 dated Apr. 23, 2025 (5 pages).
Taiwan Office Action issued in corresponding Taiwan Application No. 11420297930 dated Mar. 21, 2025 (6 pages).
Korean Office Action with English translation issued in corresponding Korean Application No. 10-2023-7010571 date of mailing Jul. 22, 2025 (18 pages).

* cited by examiner

COOLING SYSTEM FOR THE LIQUID IMMERSION COOLING OF ELECTRONIC COMPONENTS

TECHNICAL FIELD

The invention relates to a cooling system for the liquid immersion cooling of electronic components.

BACKGROUND AND SUMMARY

Cooling systems for liquid immersion cooling, for example as two-phase immersion cooling systems, are an active cooling solution for electronic components which generate a significant amount of heat during operation. When the components are immersed into a heat transfer fluid, which generally has a relatively low boiling point, the heat generated by the electronic component can vaporize the surrounding liquid heat transfer fluid, whereby heat is dissipated from the electronic component. A condenser device liquefies the vaporous heat transfer fluid which is then returned into the reservoir for cooling.

A two-phase immersion cooling system comprising a cooling basin is disclosed in the publication U.S. Pat. No. 10,512,192 B2. A condensation chamber, in which the gaseous fluid produced during the cooling process is condensed, is connected to the liquid fluid in the cooling basin. A vapor redirection structure is arranged above the heat-generating electronic components which are located inside the cooling medium in the cooling basin. The vaporized fluid is conducted by means of the vapor redirection structure into the condensation chamber for liquefication.

A cooling system for computer components is also disclosed in the publication U.S. Pat. No. 10,477,726 B1. The internal pressure is reduced to 650 hPa in the interior of a pressure-controlled container. A heat-conducting dielectric heat transfer fluid in the liquid and gaseous phase which has a boiling point of below 80° C. at atmospheric pressure is located in the container. Computer components are arranged in the container, the computer components being at least partially immersed in the liquid phase of the fluid. The dielectric gas-phase fluid which has been vaporized by the heat generated by the computer components is condensed by means of a condenser to form dielectric liquid-phase fluid.

One object of the invention is to develop a cooling system for the liquid immersion cooling of electronic components with regard to the stability of the container construction.

One aspect of the invention relates to a cooling system for the liquid immersion cooling of electronic components. The cooling system comprises a container which has a container wall and, in the interior, a reservoir for liquid heat transfer fluid and in which positioning devices for electronic components are arranged, wherein the container has a gas space for gaseous heat transfer fluid.

A heat exchanger device with heat exchanger tubes is located in the gas space of the container for liquefying gaseous heat transfer fluid, wherein the heat exchanger tubes have outer fins on their outer sides.

The heat exchanger tubes pass into the container wall or through the container wall at passage points. The heat exchanger tubes have an integral bond with the container wall at these passage points.

The gaseous heat transfer fluid of the gas space is in contact with the liquid heat transfer fluid of the reservoir at a phase boundary. The surface of the liquid heat transfer fluid in the reservoir forms the phase boundary with the gaseous heat transfer fluid in the gas space.

In other words: the heat exchanger tubes can have a smooth outer side or additionally outer fins inside the passage points at which they pass into the container wall or through the container wall. These outer fins are surrounded by the material for an integral bond and thus are hermetically sealed relative to a passage of gas or liquid. It is preferred if the outer contour of the tubes characterized by the outer fins is fused into the container wall. For a pure integral bond, it is also advantageously possible to use a combination of a non-positive connection and a positive connection.

In addition to the outer fins, a heat exchanger tube can also optionally have an internal structure. The internal structure can be designed in the form of an internally circulating helix with a predetermined helix angle. If the outer side of the heat exchanger tubes has spirally circulating outer fins, the pitch of the circumferential outer fins can be equal to, less than or greater than the pitch of the circulating helix predetermined by the helix angle. As a result, both structures can differ, in that the design of the outer fins and the internal structure can be designed independently of one another and thus optimized for the integral bond of the outer sides of a heat exchanger tube with the container wall.

To optimize the heat exchange, however, both structures are subject to certain limits. Thus the ratio of the maximum structural height of the outer fins and the maximum structural height of the internal structure preferably ranges from 1.25 to 5 for condenser tubes and preferably ranges from 0.5 to 2 for evaporator tubes.

Moreover, the cooling system can advantageously have a control device which is designed to control the operation of the fluid circulation, for example as a function of the temperature of the heat transfer fluid, and the pressure conditions in the container. By means of sensors, the pressure, temperature, conductivity and all of the parameters relevant to the process are monitored and controlled by the control device.

One aspect of the invention is based on the consideration that a particular stability of the entire construction is permanently achieved by the integral bond of the heat exchanger tubes with the container wall. Due to the direct bond at the passage points of the container wall, the sealing devices known from the prior art, such as for example O-ring seals, can be dispensed with. Due to the fixed integral bond of the heat exchanger tubes and the container wall, it is also possible to reduce the container wall relative to the otherwise usual technical solutions since the heat exchanger tubes represent quasi-struts, and thus contribute to the dimensional stability of the entire cooling system. The invention also assists, in particular, the pressure resistance during the operation of the system both regarding negative pressure and positive pressure in a hermetically sealed cooling system.

The arrangement of the heat exchanger tubes in the container is virtually freely selectable. This preferably also provides the possibility of placing the heat exchanger tubes in the gas space in the vicinity of the surface of the liquid heat transfer fluid, in particular at the points at which a particularly efficient heat transfer is required. As a result, the heat exchanger tubes perform a plurality of functions regarding mechanical stability together with efficient heat transfer. The particular advantage is that the invention leads to an optimization regarding a considerable material saving, together with a significant increase in performance.

Electronic components are arranged in the container in a suitable manner for cooling in a reservoir of liquid heat transfer fluid, the electronic components being cooled by the vaporization of this liquid fluid. The heat exchanger device of the cooling system can be selectively designed to form liquid heat transfer fluid in the gas space of the container, in the form of advantageously distributed individual tubes or even as a tube bundle. In this case, a plurality of tube bundles can also be arranged so as to be distributed as quasi-modules in the gas space of the container. In each case, these tube bundles have an integral bond with the container wall at passage points of the container wall toward the outside.

For cleaning, the heat exchanger tubes can also be accessed at the passage points from the outside. With suitable connection technology located outside the container, the system can continue to be operated at reduced cooling capacity even when the individual tubes are being cleaned. In this manner, the distribution and introduction of the cooling medium can be carried out entirely outside the container.

In a preferred embodiment of the invention, the outer fins can be directly adjacent to the container wall or come into contact therewith. This occurs, in particular, when the heat exchanger tubes still have outer fins inside the passage points at which they pass into the container wall or pass through the container wall. Thus the outer fins are maintained directly adjacent to the integral bond of the tubes with the container wall. However, for an integral bond in the case of heat exchanger tubes with non-finned ends, the tube ends are introduced sufficiently far into the dedicated passage points that the adjacent outer fins extend directly to the container wall or come into contact therewith. This has the particular advantage that the heat exchanger tubes have a full set of outer fins for an efficient heat transfer in the interior of the container.

Advantageously, the integral bond can be designed to be gas-tight and pressure-resistant. In addition to the functions regarding mechanical stability associated with an efficient heat transfer, a hermetic seal is important for preventing a fluid exchange with the surroundings in any operating mode.

In an advantageous embodiment of the invention, inside the passage points the heat exchanger tubes have a tube internal diameter D2 which is larger than the tube internal diameter D1 of the heat exchanger tubes outside the passage points.

If the heat exchanger tubes still have outer fins inside the passage points at which they pass into the container wall or pass through the container wall, according to the method a widening of the heat exchanger tube results in an enlarged tube internal diameter D2. Thus the outer fins are compressed within a passage point due to the widening. However, the integral bond ultimately ensures a stable hermetic seal.

Even in the case of heat exchanger tubes with non-finned ends, the tube ends are sufficiently widened in the passage points for the integral bond and additionally stabilized and sealed by the integral bond.

In an advantageous embodiment of the invention, the heat exchanger tubes can be soldered, adhesively bonded or welded into the container wall. In addition to the aforementioned preferred types of connection, it is also possible to add further types of connection which reliably join the heat exchanger tubes to the container wall by an integral bond.

In principle, the outer fins can preferably run on the outer sides of the heat exchanger tubes in the circumferential direction or in the axial direction parallel to the tube axis. In an advantageous embodiment of the invention, the outer sides of the heat exchanger tubes can have spirally circulating outer fins. In the case of spiral-shaped outer fins, only the channel running in a spiral-shaped manner with the outer fins has to be reliably sealed by the integral bond.

In an advantageous embodiment of the invention, the container can be designed as a pressurized container which operates at negative pressure and/or positive pressure. The operating mode of the cooling system can be variably set relative to the surrounding atmosphere regarding the existing mechanical stability associated with an efficient heat transfer at positive pressure and at negative pressure. A typical operating mode in practice is to reduce the internal pressure below atmospheric pressure and above 650 torr, wherein the dielectric fluid typically has a boiling point of less than approximately 80° C.

Even if a suitable uniform material is generally preferred for the heat exchanger tubes, in an advantageous embodiment of the invention at least one first heat exchanger tube can consist of a first material and at least one second heat exchanger tube can consist of a second material which differs from the first material. Steel tubes of particularly high strength can provide a particular advantage regarding the mechanical stability. Copper tubes, however, result in an optimization regarding an efficient heat transfer. Other materials, such as for example titanium, aluminum, aluminum alloys and copper nickel alloys, are also considered.

Advantageously, the first material can be copper and the second material can be steel. A suitable combination of individual heat exchanger tubes consisting of these two materials leads to a further optimization regarding the existing mechanical stability associated with an efficient heat transfer.

Exemplary embodiments of the invention are explained in more detail with reference to the schematic drawings.

Parts which correspond to one another are provided in all of the figures with the same reference signs.

DETAILED DESCRIPTION

Figure 1:
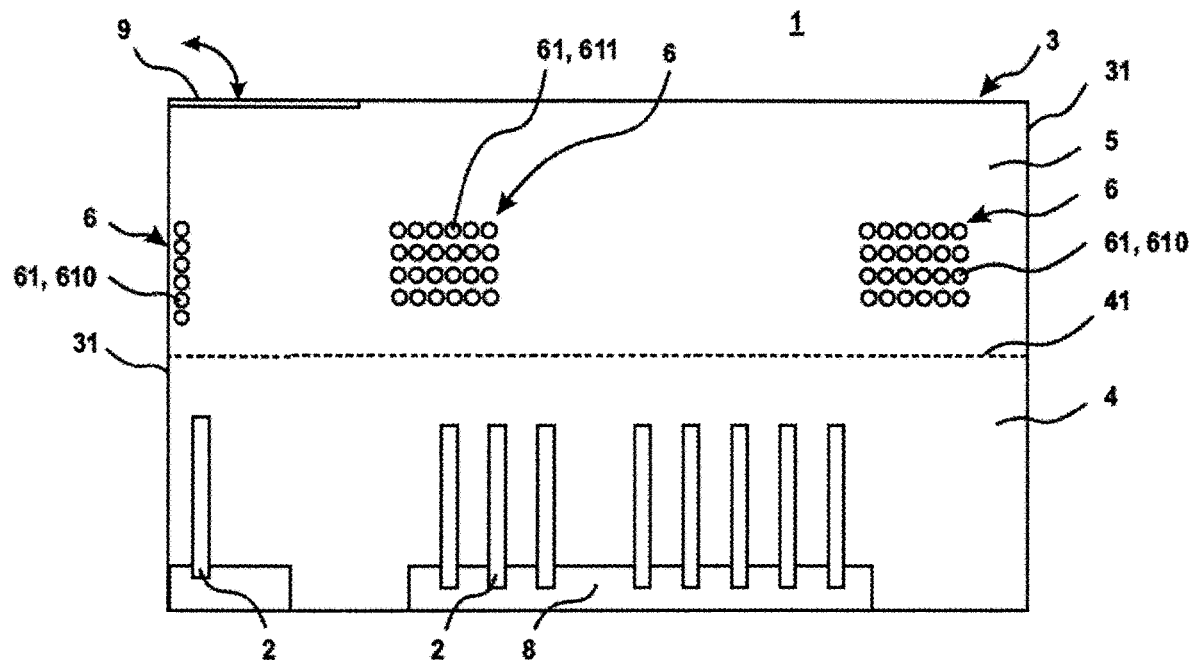
FIG. 1 shows schematically a front view of a cooling system.

FIG. 1 shows schematically a front view of a cooling system 1 for the two-phase liquid immersion cooling of electronic components 2. The cooling system 1 comprises a container 3 and a lock device 9 for exchanging electronic components 2. The electronic components 2 are immersed in the reservoir 4 comprising liquid dielectric heat transfer fluid located in the interior of the container 3. The heat exchanger devices 6 are located in the gas space 5 of the container 3 above the surface 41 of the liquid heat transfer fluid.

The cooling system 1 comprises a heat exchanger device 6 with heat exchanger tubes 61 in the gas space 5 of the container 3 for liquefying gaseous heat transfer fluid. The heat exchanger tubes 61 have outer fins on the outer sides, not shown in this figure due to the low structural height. The heat exchanger tubes 61 pass at passage points into the container wall 31 or through the container wall 31. The heat exchanger tubes 61 have an integral bond with the container wall 31 at these passage points. In principle, the arrangement of the heat exchanger tubes in the container is freely selectable. In the container, the heat exchanger tubes 61 are arranged in the gas space 5 but are preferably arranged in the form of bundles or in rows at a plurality of points in order to bring about a mechanical stability associated with an efficient heat transfer.

An automatic loading system, not shown in FIG. 1, can be arranged in the container 3 in the cooling system 1, the electronic components 2 being able to be transported from the lock device 9 to the operating position 31 in the reservoir 4 comprising liquid heat transfer fluid for the exchange of the electronic components. Gripper arms of robots or linear transport systems can transport the electronic components 2, the gripper arms automatically retrieving the electronic components 2, which are to be exchanged, from the operating position from the positioning device 8. In the reverse sequence, the electronic components 2 to be installed, and which are ready for operation, are transferred by means of the loading system into the operating position in the positioning device 8.

Figure 2:
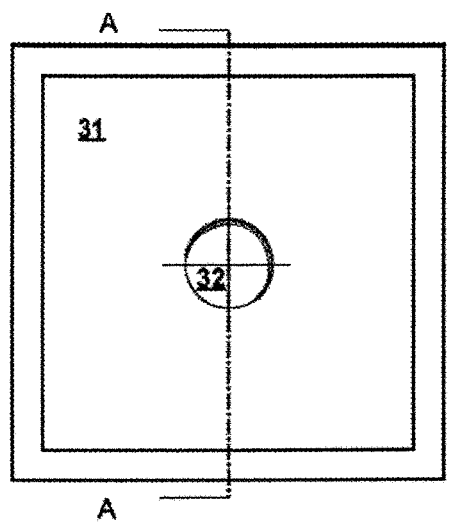
FIG. 2 shows schematically a front view of a section of the container wall with a passage point.

FIG. 2 shows schematically a front view of a section of the container wall 31 with passage points 32. The recess of the container wall 31 is preferably sufficiently large at the passage point 32 that a heat exchanger tube can be introduced therein and integrally bonded thereto. Adhesively bonded and soldered connections can be implemented at the passage point 32 across the entire wall thickness. Welded connections can be arranged externally and/or internally. With an advantageous melt flow, a welded connection which is made through the entire wall thickness can be present at the passage point 32 even if the welding is carried out on a single side from the outside or inside of the container.

Figure 3:
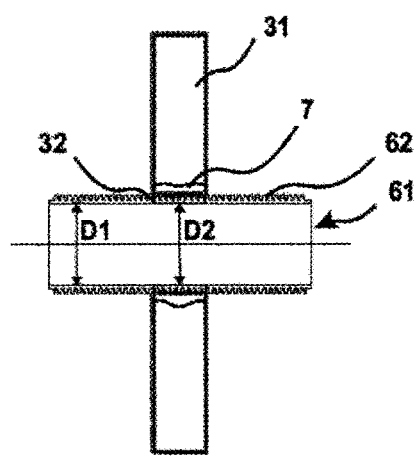
FIG. 3 shows schematically a vertical section through the container wall in the plane of the passage point of a heat exchanger tube.

FIG. 3 shows schematically a vertical section of the container wall 31 along the cutting line A-A of FIG. 2 in the plane of the passage point of a heat exchanger tube 61. The heat exchanger tube 61 shown has outer fins 62 on the outer sides. The heat exchanger tube 61 passes through the container wall 31 at the passage point 32. At this passage point the heat exchanger tube 61 has a continuous set of outer fins 62 and an integral bond 7 in the form of a continuous welded seam with the container wall 31. Depending on the material combination consisting of the container wall 31 and the heat exchanger tube 61 at the welding point, it can lead to advantageous new intermetallic phase formations in the melt bath. For example, laser welding represents a suitable method for producing an integral bond with a locally defined melt flow.

While a suitable uniform material is generally preferred for the heat exchanger tubes, in an advantageous embodiment, at least one of the heat exchanger tubes 61, or at least one first heat exchanger tube 61, can consist of a first material 610 and at least one of the heat exchanger tubes 61, or at least one second heat exchanger tube 61, can consist of a second material 611 which differs from the first material 610.

The invention claimed is:

1. A cooling system for the liquid immersion cooling of electronic components, comprising:
   a container having a container wall, an interior, a reservoir in the interior for liquid heat transfer fluid and a gas space for gaseous heat transfer fluid;
   positioning devices for electronic components arranged in the reservoir; and
   a heat exchanger device with a plurality of heat exchanger tubes in the gas space of the container for liquefying the gaseous heat transfer fluid, the heat exchanger tubes having respective outer sides with outer fins thereon, the heat exchanger tubes passing into the container wall or through the container wall at passage points, the heat exchanger tubes having an integral bond with the container wall at the passage points, at least a first one of the plurality of heat exchanger tubes comprising a first material and at least a second one of the plurality of heat exchanger tubes comprising a second material differing from the first material.

2. The cooling system as claimed in claim 1, wherein the outer fins at the passage points are directly adjacent to the container wall or come into contact with the container wall.

3. The cooling system as claimed in claim 1, wherein each integral bond is configured to be gas-tight and pressure-resistant.

4. The cooling system as claimed in claim 1, wherein the heat exchanger tubes, inside the passage points, have a tube internal diameter larger than a tube internal diameter of the heat exchanger tubes outside the passage points.

5. The cooling system as claimed in claim 1, wherein the heat exchanger tubes are soldered, adhesively bonded or welded into the container wall.

6. The cooling system as claimed in claim 1, wherein the outer sides of the heat exchanger tubes have spirally circulating outer fins.

7. The cooling system as claimed in claim 1, wherein the container is configured as a pressurized container, the pressurized container operating at negative pressure and/or positive pressure.

8. The cooling system as claimed in claim 1, wherein the first material comprises copper and the second material comprises steel.

9. The cooling system as claimed in claim 1, wherein the plurality of heat exchanger tubes in the gas space of the container all have the same thermodynamic function of liquefying the gaseous heat transfer fluid.

* * * * *